: US 10,749,063 B2
(45) Date of Patent: Aug. 18, 2020

(12) United States Patent
Yoon et al.

(10) Patent No

(54) X-RAY DETECTOR

(71) Applicant: LG DISPLAY CO., LTD., Seoul (KR)

(72) Inventors: JaeHo Yoon, Gyeongsangbuk-Do (KR); ShiHyung Park, Daegu (KR); MoonSoo Kang, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/109,088

(22) Filed: Aug. 22, 2018

(65) Prior Publication Data

US 2019/0198702 A1  Jun. 27, 2019

(30) Foreign Application Priority Data

Dec. 27, 2017 (KR) ........................ 10-2017-0181488

(51) Int. Cl.
| | |
|---|---|
| *G01T 1/24* | (2006.01) |
| *H01L 31/105* | (2006.01) |
| *H01L 27/146* | (2006.01) |
| *H01L 31/115* | (2006.01) |
| *G01T 1/20* | (2006.01) |

(52) U.S. Cl.
CPC ........ *H01L 31/1055* (2013.01); *G01T 1/2018* (2013.01); *H01L 27/14658* (2013.01); *H01L 27/14692* (2013.01); *H01L 31/115* (2013.01)

(58) Field of Classification Search
CPC .......... H01L 31/1055; H01L 27/14692; G01T 1/2018
See application file for complete search history.

(56) References Cited

U.S. PATENT DOCUMENTS

| | | | | |
|---|---|---|---|---|
| 4,692,782 | A | * | 9/1987 | Seki ....................... H01L 31/115 250/370.13 |
| 2008/0067324 | A1 | * | 3/2008 | Heiler ............... H01L 27/14658 250/208.1 |
| 2009/0050813 | A1 | | 2/2009 | Sato et al. |
| 2011/0012221 | A1 | * | 1/2011 | Fujikata ............. G02B 6/12004 257/458 |
| 2011/0139994 | A1 | | 6/2011 | Lee et al. |
| 2014/0027828 | A1 | * | 1/2014 | Kim ...................... H01L 31/118 257/292 |
| 2019/0198702 | A1 | | 6/2019 | Yoon et al. |

FOREIGN PATENT DOCUMENTS

| | | |
|---|---|---|
| CN | 107342346 A | 11/2017 |
| EP | 1304745 A2 | 4/2003 |
| JP | 2007-205935 A | 8/2007 |
| JP | 2009-233488 A | 10/2009 |
| WO | WO 97/11494 A1 | 3/1997 |

OTHER PUBLICATIONS

Taiwanese Office Action and Search Report, dated Oct. 16, 2019, for Taiwanese Application No. 107142527, along with an English translation.

\* cited by examiner

*Primary Examiner* — David P Porta
*Assistant Examiner* — Mamadou Faye
(74) *Attorney, Agent, or Firm* — Birch, Stewart, Kolasch & Birch, LLP

(57) ABSTRACT

An X-ray detector device includes in one example a switching portion and a photodetecting portion connected to the switching portion. The photodetecting portion includes a bottom electrode, a semiconductor area disposed above the bottom electrode, and a top electrode disposed above the semiconductor area. The area of the top electrode is smaller than the area of a top surface of the semiconductor area.

20 Claims, 20 Drawing Sheets

(a)

(b)

(c)

X-RAY DETECTOR

CROSS REFERENCE TO RELATED APPLICATION

This application claims priority from Korean Patent Application No. 10-2017-0181488, filed on Dec. 27, 2017 in the Republic of Korea, which is hereby incorporated by reference for all purposes as if fully set forth herein.

BACKGROUND

Field

Exemplary embodiments relate to an X-ray detector.

Description of Related Art

According to X-ray diagnosis methods that are widely used in medical applications, an image is captured using an X-ray detection film, and a predetermined period of film printing time must be taken to obtain the result of image capturing.

Recently, however, due to rapid development of semiconductor technology, research and development have been undertaken into digital X-ray detectors (DXDs) using thin-film transistors (TFTs). Such digital X-ray detectors can provide a result of diagnosis in real time, as soon as an X-ray image is captured, since the TFTs are used as switching devices.

In general, X-ray detectors are direct-type digital X-ray detectors realizing an image by detecting electric current within a panel. A direct-type digital X-ray detector includes a transparent electrode fabricated on an amorphous selenium (Se) layer stacked on the top layer of a TFT array substrate. A pixel electrode of the TFT can detect an amount of current corresponding to a degree of charges that the Se layer receives. In addition, the direct-type digital X-ray detector uses a p-intrinsic-n (PIN) diode. In the direct-type digital X-ray detector, an increase in the leakage current of the PIN diode can degrade the quality of images.

In the PIN diode, an electrode configuration thereof is sensitive to leakage current characteristics. In particular, an electric field can vary significantly, depending on the slope shape of the side-walls of the PIN diode. When the slope shape of the side-walls of the PIN diode is changed, different amounts of leakage current can flow through the PIN diode. This can consequently provide non-uniform screen images, thereby degrading the quality of the output images.

BRIEF SUMMARY

Various aspects of the exemplary embodiments of the present disclosure provide an X-ray detector that is able to maintain a leakage current of a p-intrinsic-n (PIN) diode at a predetermined level, thereby preventing image quality from degrading or improving the image quality.

According to an aspect of the present disclosure, an X-ray detector device can include a switching portion and a photodetecting portion connected to the switching portion. The photodetecting portion includes a bottom electrode, a semiconductor area disposed above the bottom electrode, and a top electrode disposed above the semiconductor area. The area of the top electrode is smaller than the area of a top surface of the semiconductor area.

According to exemplary embodiments, it is possible to maintain the leakage current of the PIN diode at a constant level, thereby causing the occurrence of the leakage current to be uniform or substantially uniform.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Figure 1:
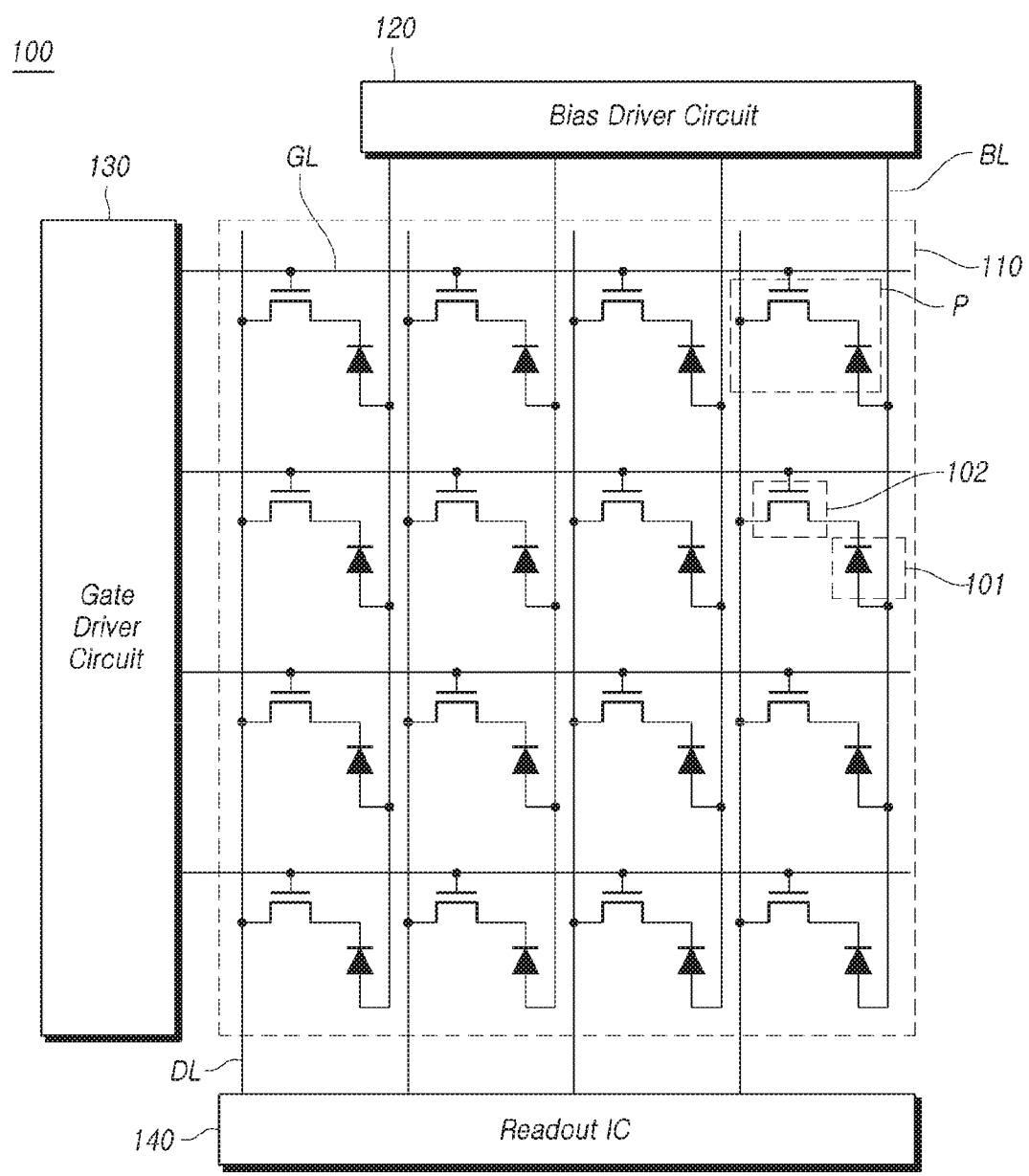
FIG. 1 is a circuit diagram illustrating an exemplary configuration of an X-ray detector according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure can be rendered unclear thereby.

It will also be understood that, while terms such as "first," "second," "A," "B," "(a)," and "(b)" can be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

FIG. 1 is a circuit diagram illustrating an exemplary configuration of an X-ray detector according to exemplary embodiments of the present disclosure. All the components of the X-ray detector according to all embodiments of the present disclosure are operatively coupled and configured.

Referring to FIG. 1, an X-ray detector 100 includes a photodetector circuit 110, a bias driver circuit 120, a gate driver circuit 130, and a readout integrated circuit (IC) 140.

The photodetector circuit 110 can detect light produced by a scintillator upon receiving X-rays emitted by an X-ray generator and output an electrical detection signal from the detected light by photoelectric conversion. The photodetector circuit 110 can include a plurality of photodetector pixels arranged in the form of a matrix, adjacently to points at which a plurality of gate lines GL and a plurality of data lines DL intersect. The plurality of gate lines GL and the plurality of data lines DL can intersect, more particularly, at right angles. However, the present disclosure is not limited thereto. Although the photodetector circuit 110 is illustrated as including, by way of example, sixteen (16) photodetector pixels P arranged in four columns and four rows, the present disclosure is not limited thereto, and the number of photodetector pixels P and/or their arrangements can be varied.

Each of the photodetector pixels P can include a photodetecting portion 101 outputting an electrical detection signal, for example, a photo-detection voltage, by detecting light produced by the scintillator in response to X-rays and a switching portion 102 transferring the electrical detection signal, output by the photodetecting portion 101, in response to a gate signal output by the gate driver circuit 130.

The photodetecting portion 101 detects light produced by the scintillator and outputs an electrical detection signal from the detected light by photoelectric conversion. The photodetecting portion 101 can include a device converting incident light into an electrical signal by a photoelectric effect. In addition, the photodetecting portion 101 can include a p-intrinsic-n (PIN) diode. The PIN diode has an undoped intrinsic semiconductor region between a p-type semiconductor region and an n-type semiconductor region.

The switching portion 102 can transfer a detection signal output by the photodetecting portion 101. The switching portion 102 can include a transistor, with a gate electrode thereof being electrically connected to a gate line among the plurality of gate lines GL, and a source electrode thereof being electrically connected to the readout IC 140 via a data line among the plurality of data lines DL. The bias driver circuit 120 can be electrically connected to the photodetecting portion 101. Specifically, the bias driver circuit 120 can apply a bias voltage to the photodetecting portion 101 via a plurality of bias lines BL. The bias driver circuit 120 can selectively apply a reverse bias or a forward bias to the photodetecting portion 101.

The gate driver circuit 130 can sequentially apply gate signals having gate-on voltage levels to the plurality of gate lines GL. The switching portions 102 of the photodetector pixels P can be turned on in response to a gate pulse. When a switching portion 102 is turned on, a detection signal output by a photodetecting portion 101 can be input to the readout IC 140 through the switching portion 102 and a data line DL. The gate driver circuit 130 can be provided as an IC to be mounted on one surface of the photodetector circuit 110 or can be provided on a printed circuit board, such as the photodetector circuit 110, by thin-film processing.

The readout IC 140 can receive and output a detection signal output by the switching portion 102 turned on in response to a gate signal. The readout IC 140 can read and transfer the detection signal to a signal processing device, which in turn can digitize and output the detection signal. The digitized detection signal can be supplied to a separate display device as an image signal.

Figure 2:
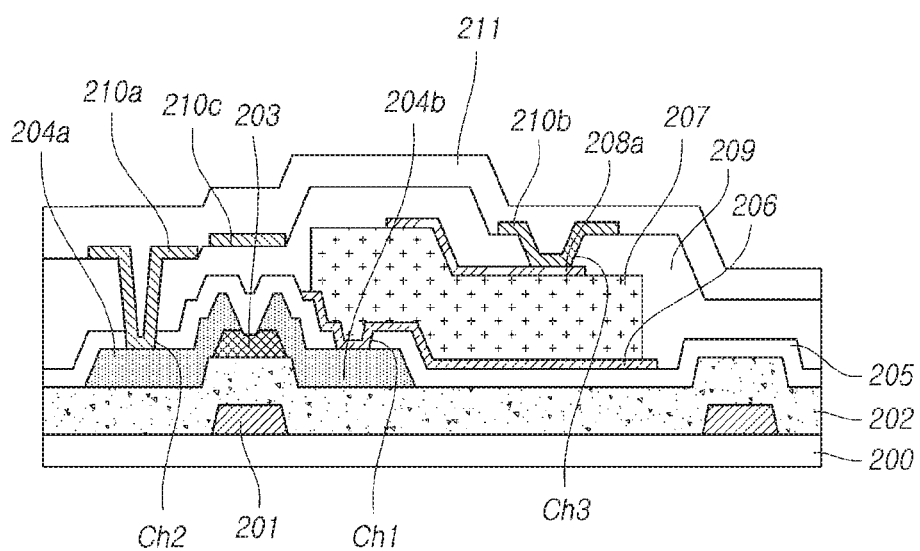
FIG. 2 is a cross-sectional view illustrating an example of the photodetector pixel used in the X-ray detector illustrated in FIG. 1.

FIG. 2 is a cross-sectional view illustrating an example of the photodetector pixel P used in the X-ray detector illustrated in FIG. 1.

Referring to FIG. 2, the photodetector pixel P can be disposed in a pixel region, among a plurality of pixel regions, defined by the intersection of the data lines DL and the gate lines GL disposed on the photodetector circuit 110 of the X-ray detector 100. Each of the photodetector pixels P can include a photodetecting portion 101 converting a photoelectric signal into an electrical signal and a switching portion 102 performing a switching operation to drive the photodetecting portion 101. In addition, the photodetecting portion 101 can include a PIN diode 206, 207, and 208a, while the switching portion 102 can include a thin-film transistor (TFT) 201, 203, 204a, and 204b.

The TFT 201, 203, 204a, and 204b can include a gate electrode 201 connected to a gate line GL among the plurality of gate lines GL, an active layer 203 located on the gate electrode 201, a source electrode 204a connecting one end of the active layer 203 to a data line electrode 210a connected to a data line DL among the plurality of data lines DL, and a drain electrode 23 connected to the other end of the active layer 203. A drain electrode 204b can be connected to the photodetecting portion 101. The photodetecting portion 101 can be connected to a bias electrode line 210b connected to a bias line BL among the plurality of bias lines BL, through which biases for controlling electrons or holes are applied. The bias lines BL can be made of a metal.

The gate electrode 201 can be provided by depositing a gate metal on a substrate 200 and patterning the deposited gate metal. The gate electrode 201 can be made of one selected from among, but not limited to, aluminum (Al), molybdenum (Mo), and alloys thereof. A gate insulating film 202 can be disposed on the substrate 200 including the gate electrode 201. In addition, an active layer 203 can be disposed above the gate insulating film 202. The active layer 203 can include a first amorphous silicon layer undoped with impurities and a second amorphous silicon layer doped with an n-type impurity. In addition, the source electrode 204a and the drain electrode 204b can be provided by depositing and patterning a source/drain metal above the active layer 203. The source/drain metal can be one selected from among, but not limited to, Al, Mo, and alloys thereof. A first insulating film 205 can be provided above the gate insulating film 202 including the source electrode 204a and the drain electrode 204b. In addition, a bottom electrode 206 of the photodetecting portion 101 can be disposed above the first insulating film 205. The bottom electrode 206 can be referred to as a cathode.

The first insulating film 205 can have a first contact hole ch1 provided in a position overlapping the drain electrode 204b, the first contact hole ch1 connecting the bottom electrode 206 to the drain electrode 204b. The PIN diode 206, 207, and 208a can be disposed on the bottom electrode 206. The PIN diode 206, 207, and 208a can include a semiconductor area 207 in which an n-type semiconductor layer, an intrinsic semiconductor layer, and a p-type semiconductor layer are sequentially disposed. A top electrode 208a can be disposed above the semiconductor area 207 of the PIN diode 206, 207, and 208a. The top electrode 208a can be a transparent electrode. The top electrode 208a can be an indium tin oxide (ITO) electrode. A second insulating film 209 can be disposed above the top electrode 208a. The top electrode 208a can be referred to as an anode.

A second contact hole ch2 can be provided in a position overlapping the source electrode 204a so as to extend through the first insulating film 205 and the second insulating film 209, such that the data line electrode 210a is connected to the source electrode 204a via the second contact hole ch2. In addition, a third contact hole ch3 can be provided in a position overlapping the top electrode 208a, and the data line electrode 210a can be connected to the top electrode 208a via the third contact hole ch3. In addition, a light-blocking film 210c can be provided above the second insulating film 209, in a position overlapping the gate electrode 201. The light-blocking film 210c can prevent a leakage current from flowing through the TFT 201, 203, 204a, and 204b. In addition, a third insulating film 211 can be provided above the second insulating film 209. The data line electrode 210a, the bias line electrode 210b, and the light-blocking film 210c can be fabricated in the same process. The data line electrode 210a, the bias line electrode 210b, and the light-blocking film 210c can be made of the same material.

FIGS. 3A to 3D are cross-sectional views illustrating a process of fabricating a photodetecting portion according to an embodiment of the present disclosure.

Figure 3A:
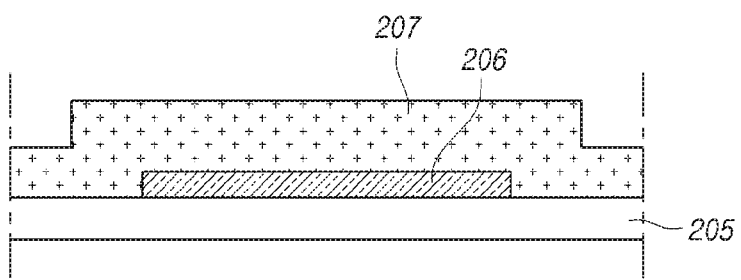
FIGS. 3A to 3D are cross-sectional views illustrating a process of fabricating a photodetecting portion according to an embodiment.

The PIN diodes 206, 207, and 208a of the photodetecting portion 101 can include the bottom electrode 206 provided above the first insulating film 205, as illustrated in FIG. 3A. Although the bottom electrode 206 is illustrated as being parallel to the horizontal surface, the present disclosure is not limited thereto and can include other variations. The semiconductor area 207 can be provided above the bottom electrode 206. The semiconductor area 207 can include a p-type semiconductor layer, an intrinsic semiconductor layer, and an n-type semiconductor layer. Although the top surface of the semiconductor area 207 is illustrated as being parallel to the horizontal surface, the top surface of the semiconductor area 207 can conform to the bottom electrode 206.

Figure 3B:
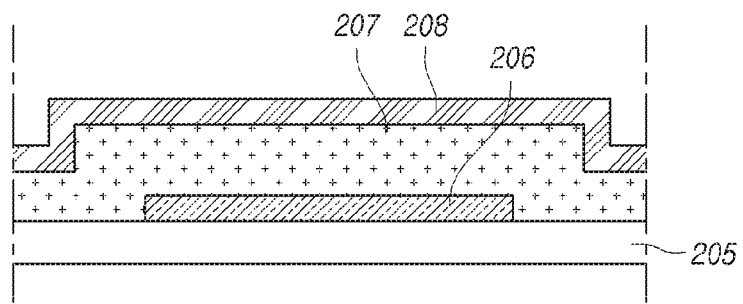
Figure 3C:
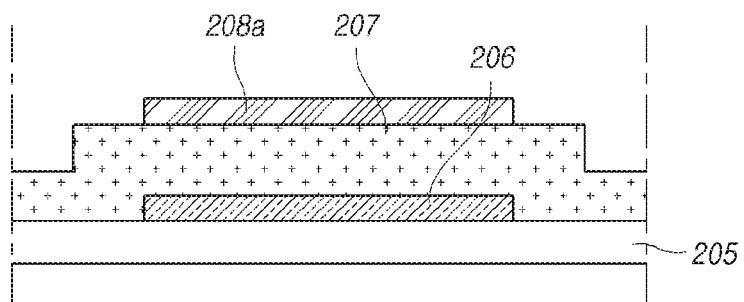
Figure 3D:
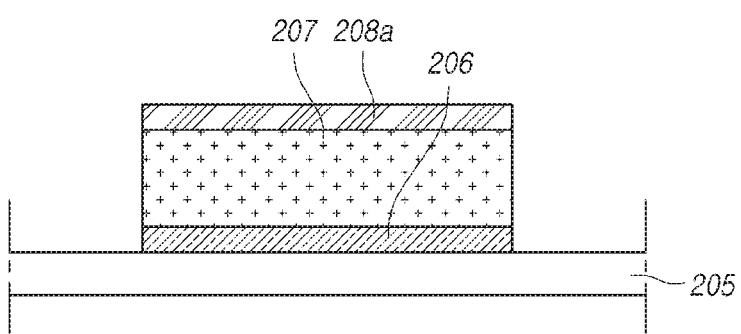

As illustrated in FIG. 3B, a top electrode metal 208 can be provided above the semiconductor area 207. In addition, performing wet etching can realize the top electrode 208a above the semiconductor area 207, as illustrated in FIG. 3C. Dry etching can be performed using the top electrode 208a as a mask. Performing dry etching can etch the semiconductor area 207 to conform to the top electrode 208a. This can consequently fabricate the PIN diode 206, 207, and 208a, including the top electrode 208a, the bottom electrode 206, and the semiconductor area 207 corresponding to the top electrode 208a and the bottom electrode 206. In the semiconductor area 207, the n-type semiconductor layer, the intrinsic semiconductor layer, and the p-type semiconductor layer can be sequentially disposed above the bottom electrode 206. In the PIN diode 206, 207, and 208a, as illustrated in FIG. 3D, the side-walls of the semiconductor area 207 can be provided to correspond to the edges of the top electrode 280a.

Figure 4:
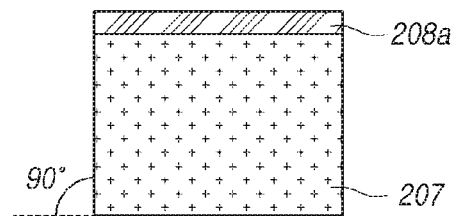
FIG. 4, including (a) to (c), shows cross-sectional views illustrating examples of the shape of the PIN diode according to an embodiment.
Figure 4:
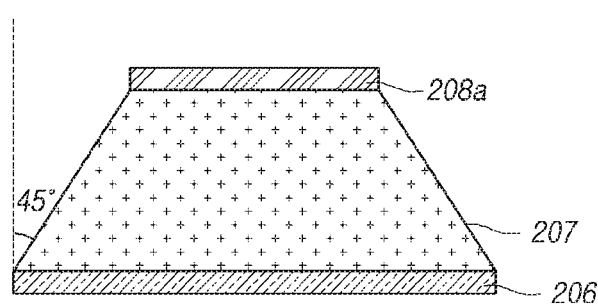
Figure 4:
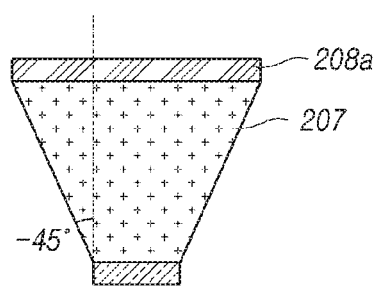

However, in the PIN diodes 206, 207, and 208a, the side-walls of the semiconductor area 207, corresponding to the photodetector pixels P, can have a variety of slopes, as illustrated in FIG. 4, due to deviations occurring during the process of drying etching.

Referring to FIG. 4, the slope of the side-walls of the PIN diode 206, 207, and 208a can be 90 degrees as illustrated in (a) of FIG. 4, 45 degrees as illustrated in (b) of FIG. 4, or −45 degrees as illustrated in (c) of FIG. 4. The angles, such as 90 degrees, 45 degrees, and −45 degrees, used herein, are illustrative only, and the slope of the side-walls is not limited thereto. For example, the side-walls of the PIN diode 206, 207, and 208a can extend in the direction of the bottom electrode 206 at a slope selected from among any acute angle, any obtuse angle, and a right angle with respect to a vertical line.

Figure 5:
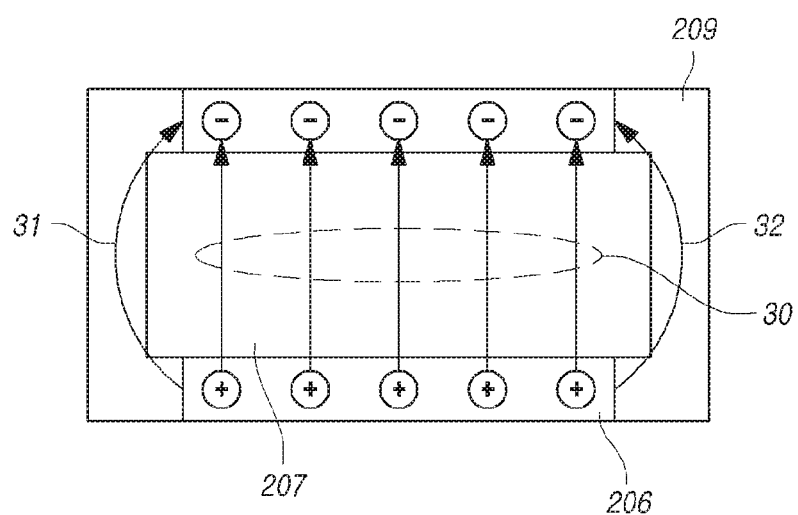
FIG. 5 is a conceptual view illustrating the direction of exemplary electric lines occurring in the PIN diode according to exemplary embodiments.

In addition, as illustrated in FIG. 5, the PIN diode 206, 207, and 208a can be disposed between portions of the second insulating film 209, and electric lines 30 can pass between the top electrode 208a and the bottom electrode 206. When the electric lines 30 proceed from the bottom electrode 206 to the top electrode 208a, the electric lines 30 pass through the semiconductor area 207. However, some electric lines 31 and 32 can pass through the second insulating film 209, so that a leakage current can pass through the second insulating film 209 in addition to the semiconductor area 207. When the slope of the side-walls of the semiconductor area 207 is not constant, as illustrated in FIG. 4, different amounts of leakage current can flow through the second insulating film 209, thereby varying the magnitude of current flowing through the photodetecting portion 101. The varying magnitude of current can cause different amounts of current to be transferred to the readout IC 140 through the data lines DL. Consequently, the readout IC 140 can be supplied with non-uniform current and generate image signals based on the non-uniform current, which is problematic.

FIGS. 6A to 6E are cross-sectional views illustrating a process of fabricating a photodetecting portion according to exemplary embodiments.

Figure 6A:
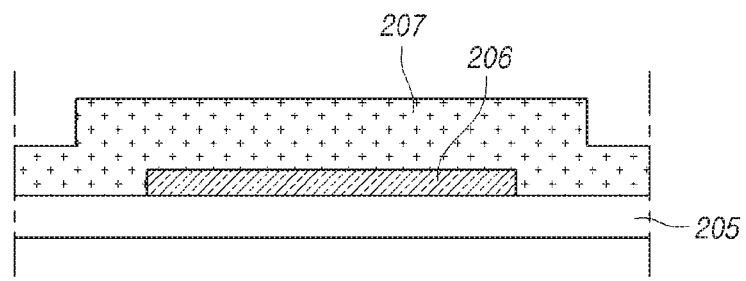
FIGS. 6A to 6E are cross-sectional views illustrating a process of fabricating a photodetecting portion according to exemplary embodiments.

As illustrated in FIG. 6A, the semiconductor area 207 can be provided above the bottom electrode 206. Although the bottom electrode 206 is illustrated as being parallel to the horizontal surface, the bottom electrode is not limited thereto and can have other variations. The semiconductor area 207 can include a p-type semiconductor layer, an intrinsic semiconductor layer, and an n-type semiconductor layer. Although the top surface of the semiconductor area 207 is illustrated as being parallel to the horizontal surface, the top surface of the semiconductor area can conform to the bottom electrode 206 or can have other variations.

Figure 6B:
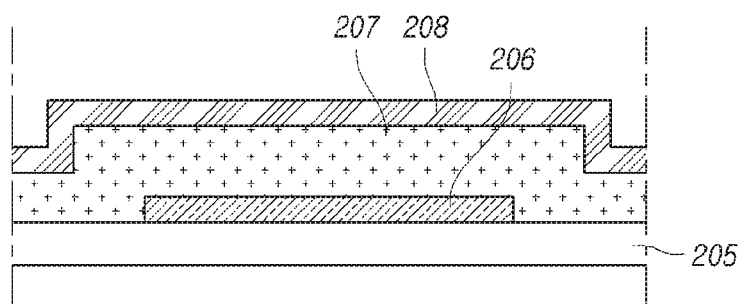
Figure 6C:
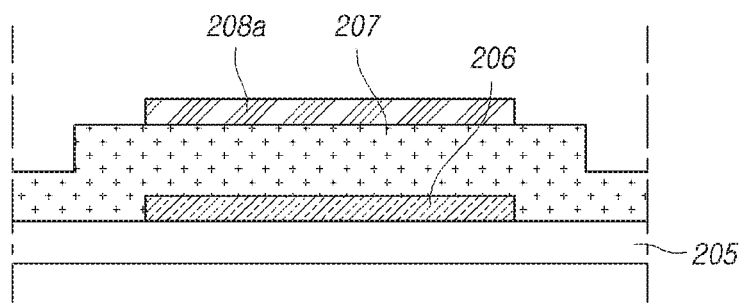

As illustrated in FIG. 6B, the top electrode metal 208 can be provided above the semiconductor area 207. The top electrode metal 208 can be made of ITO. When wet etching is performed, the top electrode 208a can be provided above the semiconductor area 207, as illustrated in FIG. 6C. In addition, when dry etching the semiconductor area 207 using a mask, the semiconductor area 207, conforming to the top electrode 208a, can be etched. Consequently, the PIN diode 206, 207, and 208a, including the top electrode 208a, the bottom electrode 206, and the semiconductor area 207 corresponding to the top electrode 208a and the bottom electrode 206, can be provided.

Figure 6D:
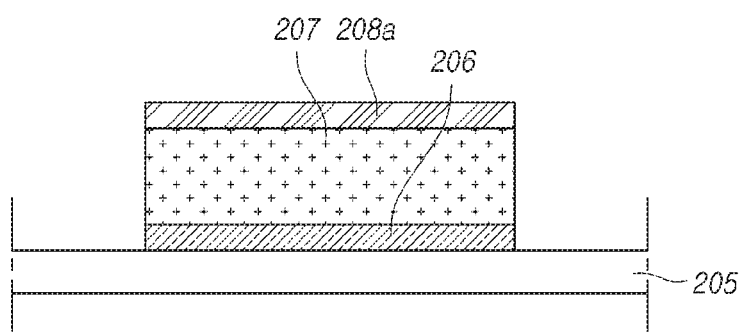

As illustrated in FIG. 6D, the PIN diode 206, 207, and 208a can be configured such that the side-walls thereof conform to the edges of the top electrode 208a. The side-walls of the PIN diode 206, 207, and 208a, corresponding to each of the photodetector pixels P, can have the shapes illustrated in FIG. 4, due to deviations occurring during the process of drying etching.

In addition, the top electrode 208a can be wet etched. When the top electrode 208a is wet etched, the size of the top electrode 208a can be reduced by etching. The term "size" used herein can mean the area of the top electrode 208a. However, the present disclosure is not limited thereto, and both the area and height can be reduced.

Figure 6E:
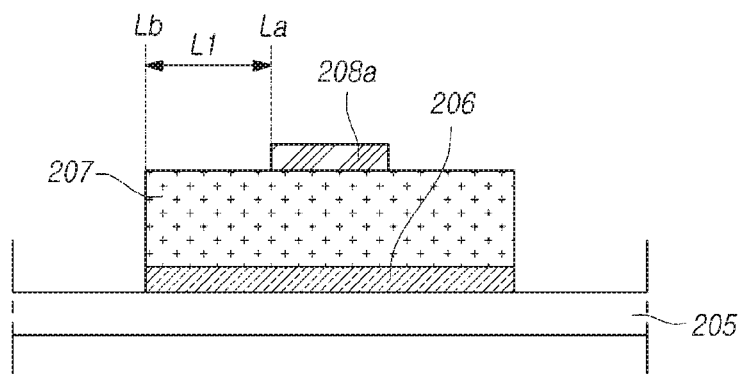

When the top electrode 208a is wet etched, the size of the top electrode 208a can be reduced to be smaller than the size of the top surface of the PIN diode 206, 207, and 208a, as illustrated in FIG. 6E. The distance between the periphery La of the top electrode 208a and the periphery Lb of the semiconductor area 207 can be referred to as a first length L1. In addition, the periphery La of the top electrode 208a and the periphery Lb of the semiconductor area 207 can be parallel to each other.

Figure 7A:
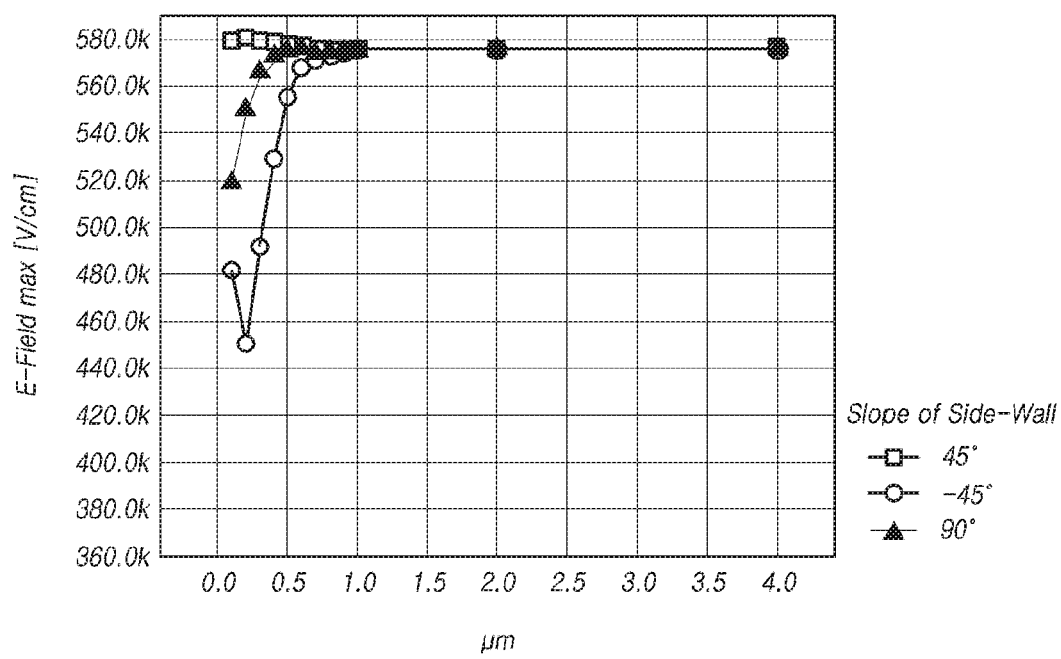
FIGS. 7A and 7B are graphs respectively representing an electric field produced with respect to the slope of side-walls of a PIN diode.
Figure 7B:
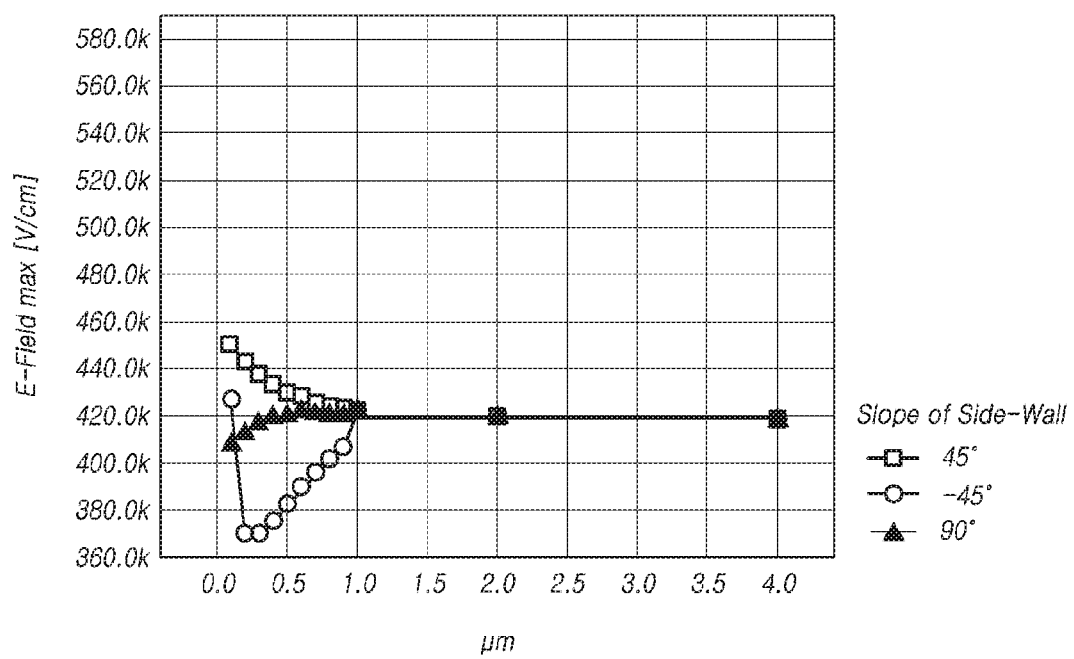

FIGS. 7A and 7B are graphs respectively representing an electric field produced with respect to the slope of side-walls of a PIN diode. The horizontal axis indicates a length between the periphery La of the top electrode 208a and the periphery Lb of the semiconductor area 207, while the vertical axis indicates the intensity of the electric field.

In addition, FIG. 7A represents a case in which the thickness of the PIN diode 206, 207, and 208a is 5,000 Å, while FIG. 7B represents a case in which the thickness of the PIN diode 206, 207, and 208a is 10,000 Å.

Referring to FIGS. 7A and 7B, it is appreciated that the intensity of the electric field applied to the top electrode 208a and the bottom electrode 206 of the PIN diode 206, 207, and 208a varies, depending on the length between the periphery La of the top electrode 208a and the periphery Lb of the semiconductor area 207. Referring to FIG. 7A, it is appreciated that the electric field is saturated when the length between the periphery La of the top electrode 208a and the periphery Lb of the semiconductor area 207 is 0.5 μm. Referring to FIG. 7B, it will be appreciated that the electric field is saturated when the length between the periphery La of the top electrode 208a and the periphery Lb of the semiconductor area 207 is 1 μm.

Consequently, the longer the periphery La of the top electrode 208a from the periphery Lb of the semiconductor area 207 is, the shorter the unsaturated area is. The smaller the area of the top electrode 208a is than the area of the top portion of the semiconductor area 207, the more uniform the amount of current flowing from the bottom electrode 206 to the top electrode 208a can be maintained.

Figure 8A:
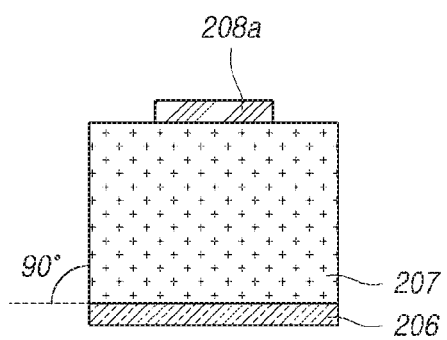
FIGS. 8A to 8C are cross-sectional views illustrating examples of the shape of the PIN diode according to an embodiment.
Figure 8B:
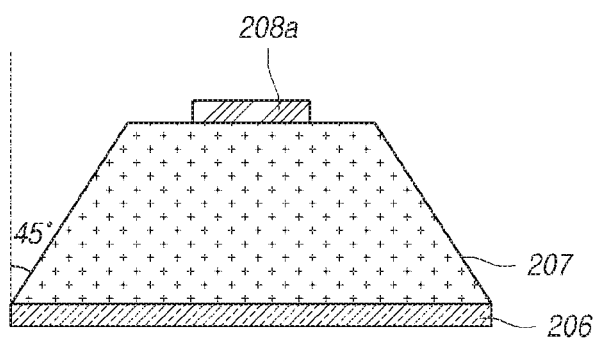
Figure 8C:
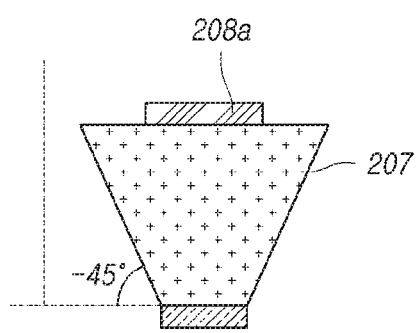

FIGS. 8A to 8C are cross-sectional views illustrating examples of the shape of the PIN diode according to an embodiment of the present disclosure.

Referring to FIGS. 8A to 8C, the side-walls of the semiconductor area 207 of the PIN diode 206, 207, and 208a can have a variety of slopes during the process of dry etching. For example, the slope of the side-walls of the semiconductor area 207 can be 90 degrees as illustrated in FIG. 8A, 45 degrees as illustrated in FIG. 8B, or −45 degrees as illustrated in FIG. 8C. The angles, such as 90 degrees, 45 degrees, and −45 degrees, used herein, are illustrative only, and the slope of the side-walls is not limited thereto and can vary.

In addition, the top electrode 208a can be configured to be shorter than the length of the top portion of the semiconductor area 207, regardless of the slope of the side-walls of the semiconductor area 207.

Thus, the semiconductor area 207, included in each of the photodetecting portions of a plurality of photodetector circuits, can be configured such that the top portion thereof is covered with the top electrode 208a and the side-walls thereof extend in the direction of the bottom electrode 206 at an angle selected from among a right angle, an acute angle, and an obtuse angle with respect to the vertical line.

Figure 9:
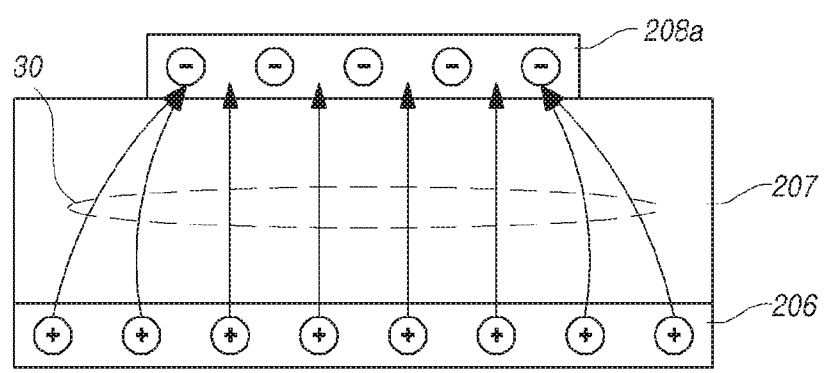
FIG. 9 is a conceptual view illustrating the direction of exemplary electric lines occurring in the PIN diode according to exemplary embodiments.

In addition, as illustrated in FIG. 9, the PIN diode 206, 207, and 208a can be disposed between portions of the second insulating film 209, and electric lines 30 can pass between the top electrode 208a and the bottom electrode 206. When the area of the top electrode 208a is smaller than the area of the semiconductor area 207 and the periphery La of the top electrode 208a is more adjacent to the central portion of the PIN diode 206, 207, and 208a than the periphery Lb of the semiconductor area 207, when the electric lines 30 proceed from the bottom electrode 206 to the top electrode 208a, a leakage current only passes through the semiconductor area 207 without flowing through the second insulating film 209. This can consequently reduce the amount of the leakage current, so that a constant amount of current can be detected by the photodetecting portion 101. Although the slope of the side-walls of the semiconductor area 207 of the PIN diode 206, 207, and 208a has been described herein as being 90 degrees, the present disclosure is not limited thereto and can include other variations. In addition, when the periphery of the top electrode 208a is located to be more adjacent to the central portion of the PIN diode 206, 207, and 208a than the periphery of the semiconductor area 207, regardless of the slope of the side-walls of the semiconductor area 207, the amount of leakage current flowing through the second insulating film 209 can be reduced, so that a constant amount of current can be detected by the photodetecting portion 101.

Figure 10:
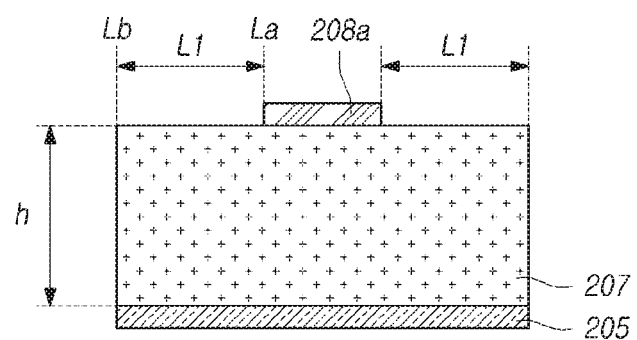
FIG. 10 is a cross-sectional view illustrating the relationship between the height and first length of the PIN diode according to exemplary embodiments.

FIG. 10 is a cross-sectional view illustrating the relationship between the height and first length of the PIN diode according to examples of the present disclosure.

Referring to FIG. 10, levels of output sensitivity, regarding the relationship between the height h and the first length L1 of the PIN diode 206, 207, and 208a, were measured. Although the height of the PIN diode 206, 207, and 208a has been described as being the height of the semiconductor area 207, the present disclosure is not limited thereto and can include other variations. The bottom electrode 206 and the top electrode 208a can have very low heights, such that the height of the PIN diode 206, 207, and 208a includes the heights of the bottom electrode 206 and the top electrode 280a.

TABLE 1

|  | 1 | 2 | 3 | 4 | 5 | 6 | 7 | 8 | 9 |
| --- | --- | --- | --- | --- | --- | --- | --- | --- | --- |
| 1$^{st}$ Length (L1) | +3570 Å | +2540 Å | +100 Å | 0 Å | −5520 Å | −7143 Å | −10300 Å | −11800 Å | −13200 Å |
| Output (LSB) | 5500 | 5000 | 3500 | 2800 | 2350 | 2150 | 2000 | 1900 | 1700 |

In Table 1 above, the sign "+" indicates that the area of the top electrode 208a is greater than the size of the semiconductor area 207 of the PIN diode 206, 207, and 208a, such that the top electrode 280a is exposed from the periphery Lb of the semiconductor area 207 of the PIN diode 206, 207, and 208a, the sign "0" indicates that the area of the top electrode 208a is the same as the size of the PIN diode 206, 207, and 208a, and the sign "−" indicates that the area of the top electrode 280a is smaller than the size of the semiconductor area 207, such that the periphery La of the top electrode 208a is located more adjacent to the center of the PIN diode 206, 207, and 208a. In addition, the measurement was performed when the height h of the semiconductor area 207 was 10,000 Å. In this case, an ordinary output value produced by detecting a current was 2,000 LSB.

It is appreciated that, when the height h of the semiconductor area was 10,000 Å and the first length was in the range from 7,143 Å to 11,800 Å, the output value was from 2,150 to 1,900.

Accordingly, a value obtained by dividing the first length L1 between the periphery La of the top electrode 208a and the periphery Lb of the semiconductor area 207 with the height h of the semiconductor area 207 can be in the range from 1/1.2 to 1/0.8.

The foregoing descriptions and the accompanying drawings have been presented in order to explain the certain principles of the present disclosure. A person skilled in the art to which the present disclosure relates could make various modifications and variations by combining, dividing, substituting for, or changing the elements without departing from the principle of the present disclosure. The foregoing embodiments disclosed herein shall be interpreted as illustrative, while not being limitative, of the principle and scope of the present disclosure. It should be understood that the scope of the present disclosure shall be defined by the appended Claims and all of their equivalents fall within the scope of the present disclosure.

What is claimed is:

1. An X-ray detector device comprising:
   a photodetecting portion including:
     a bottom electrode,
     a top electrode, and
     a semiconductor area disposed between the bottom electrode and the top electrode,
   wherein an area of the top electrode is smaller than an area of a top surface of the semiconductor area,
   wherein a height of the semiconductor area is approximately equal to a distance between an outermost edge of the top electrode and an outermost edge of the semiconductor area, and
   wherein a side-wall of the semiconductor area extends in a direction from the bottom electrode at an acute angle or an obtuse angle with respect to a vertical line.

2. The X-ray detector device according to claim 1, wherein the acute angle is approximately 45 degrees.

3. The X-ray detector device according to claim 1, wherein the obtuse angle is approximately 135 degrees.

4. An X-ray detector device comprising:
   a photodetecting portion including:
     a bottom electrode,
     a top electrode, and
     a semiconductor area disposed between the bottom electrode and the top electrode,
   wherein an area of the top electrode is smaller than an area of a top surface of the semiconductor area,
   wherein an outermost edge of the top electrode is closer to a center of the semiconductor area than an outermost edge of the semiconductor area,
   wherein a first length between the outermost edge of the top electrode and the outermost edge of the semiconductor area has a specific spatial relationship with a height of the semiconductor area,
   wherein the specific spatial relationship is a ratio of the first length to the height being between 1:0.8 to 1:1.2, and
   wherein a side-wall of the semiconductor area extends in a direction from the bottom electrode at an acute angle or an obtuse angle with respect to a vertical line.

5. The X-ray detector device according to claim 4, further comprising:
   a switching portion,
     wherein the switching portion comprises a transistor comprising a source electrode, a gate electrode, and a drain electrode, and
   the bottom electrode is connected to the source electrode or the drain electrode of the transistor.

6. The X-ray detector device according to claim 4, further comprising:
   a switching portion including a transistor comprising a source electrode, a gate electrode, and a drain electrode,
   the X-ray detector device further comprising:
   a data line electrode connected to a data line connected to the drain electrode or the source electrode of the transistor; and
   a bias line electrode connected to the top electrode and a bias line,
   wherein the data line electrode and the bias line electrode contain a same material.

7. The X-ray detector device according to claim 4, wherein a light-blocking film is disposed at a position overlapping the gate electrode of the switching portion.

8. The X-ray detector device according to claim 1, further comprising:
   a switching portion,
     wherein the switching portion comprises a transistor comprising a source electrode, a gate electrode, and a drain electrode, and
   the bottom electrode is connected to the source electrode or the drain electrode of the transistor.

9. The X-ray detector device according to claim 1, wherein a first length between the periphery of the top electrode and the periphery of the semiconductor area corresponds to a height of the semiconductor area.

10. The X-ray detector device according to claim 9, wherein a value by dividing the first length between the periphery of the top electrode and the periphery of the semiconductor area with a height of the semiconductor area is in a range of approximately 1/1.2 to 1/0.8.

11. The X-ray detector device according to claim 8, further comprising:
    a data line electrode connected to a data line connected to the drain electrode or the source electrode of the transistor; and
    a bias line electrode connected to the top electrode and a bias line.

12. The X-ray detector device according to claim 11, wherein the data line electrode and the bias line electrode contain a same material.

13. The X-ray detector device according to claim 11, wherein a light-blocking film is disposed at a position overlapping the gate electrode of the switching portion.

14. The X-ray detector device according to claim 11, further comprising:
    a bias driver connected to the photodetecting portion and applying a bias voltage to the photodetecting portion;
    a gate driver turning on the switching portion by applying a gate signal to the switching portion; and
    a readout integrated circuit receiving a signal output by the switching portion, in response to the gate signal, and generating an image signal.

15. The X-ray detector device according to claim 1, wherein a width of the semiconductor area is equal to a width of the bottom electrode.

16. The X-ray detector device according to claim 1, wherein an outermost side edge of the semiconductor area is flush with an outermost side edge of the bottom electrode.

17. The X-ray detector device according to claim 4, further comprising:
a switching portion,
wherein the switching portion comprises a transistor comprising a source electrode, a gate electrode, and a drain electrode, and
the bottom electrode is connected to the source electrode or the drain electrode of the transistor.

18. The X-ray detector device according to claim 4, wherein a first length between the periphery of the top electrode and the periphery of the semiconductor area corresponds to a height of the semiconductor area.

19. The X-ray detector device according to claim 15, further comprising:
a data line electrode connected to a data line connected to the drain electrode or the source electrode of the transistor; and
a bias line electrode connected to the top electrode and a bias line.

20. The X-ray detector device according to claim 17, further comprising:
a bias driver connected to the photodetecting portion and applying a bias voltage to the photodetecting portion;
a gate driver turning on the switching portion by applying a gate signal to the switching portion; and
a readout integrated circuit receiving a signal output by the switching portion, in response to the gate signal, and generating an image signal.

* * * * *